US007403439B2

(12) United States Patent
Miller et al.

(10) Patent No.: US 7,403,439 B2
(45) Date of Patent: Jul. 22, 2008

(54) BITLINE LEAKAGE LIMITING WITH IMPROVED VOLTAGE REGULATION

(75) Inventors: Christopher Miller, Underhill, VT (US); Charles Drake, Underhill, VT (US)

(73) Assignee: Qimonda North America Corp., Cary, NC (US)

( * ) Notice: Subject to any disclaimer, the term of this patent is extended or adjusted under 35 U.S.C. 154(b) by 170 days.

(21) Appl. No.: 11/414,364

(22) Filed: May 1, 2006

(65) Prior Publication Data

US 2007/0253265 A1 Nov. 1, 2007

(51) Int. Cl.
G11C 7/00 (2006.01)
(52) U.S. Cl. .................. 365/203; 365/205; 365/189.02; 365/202
(58) Field of Classification Search .................. 365/203, 365/205, 189.02, 202
See application file for complete search history.

(56) References Cited

U.S. PATENT DOCUMENTS

| 5,113,372 | A | * | 5/1992 | Johnson ...................... 365/203 |
| 5,673,231 | A | | 9/1997 | Furutani |
| 6,016,279 | A | | 1/2000 | Chi |
| 6,018,481 | A | | 1/2000 | Shiratake |
| 6,343,038 | B1 | | 1/2002 | Makino et al. |
| 6,452,859 | B1 | | 9/2002 | Shimano et al. |
| 6,501,687 | B2 | * | 12/2002 | Choi ...................... 365/189.11 |
| 6,850,454 | B2 | | 2/2005 | Kuge et al. |
| 7,106,641 | B2 | | 9/2006 | Tsukada |
| 2004/0047225 | A1 | | 3/2004 | Hayakawa |

* cited by examiner

Primary Examiner—Huan Hoang
(74) Attorney, Agent, or Firm—Edell, Shapiro & Finnan, LLC

(57) ABSTRACT

Circuit arrangements and methods are provided for regulating and maintaining voltage on bitlines of a semiconductor memory device. According to one embodiment, first and second regulation devices are connected to a charging circuit. At the beginning of a charging period, voltage on the bitlines is regulated with the second regulation device as the bitlines are initially charged to a voltage. After initially charging the bitlines to the voltage, voltage on the bitlines is regulated with the first regulation device that also limits current to the bitlines when there is a leakage anomaly associated with the bitlines. According to another embodiment, a charging circuit that is connected to sense nodes of a sense amplifier while the sense nodes are connected to the bitlines is activated so that the charging circuit assists in charging the bitlines at the beginning of a charging period. After the bitlines are initially charged at the beginning of the charging period, voltage on the bitlines is regulated with a first regulation device that regulates current to the bitlines and limits current to the bitlines when there is a leakage anomaly associated with the bitlines.

22 Claims, 6 Drawing Sheets

BITLINE LEAKAGE LIMITING WITH IMPROVED VOLTAGE REGULATION

BACKGROUND OF THE INVENTION

FIG. 1 shows conventional sense amplifier circuitry for a semiconductor memory device comprising a sense amplifier 10, first and second multiplexers 20 and 30 on opposite sides of the sense amplifier 10, and restore circuits 40 and 50 also on opposite sides of the sense amplifier 10. The restore circuits 40 and 50 are also known as equalization circuits because they precharge and equalize (i.e., "restore") voltage on the bitlines (BLs) to which they connect. The sense amplifier 10 is connected to memory storage cells on one side, called the "t" side, when it is connected to bitline pairs (comprised of a BL and BL complement) 60 and 62. Similarly, the sense amplifier 10 is connected to memory cells on the other side, called the "b" side, when it is connected to BL pairs 70 and 72. Multiplexer 20 controls the connection of the sense amplifier 10 to BL pairs 60 and 62 when memory cells on the "t" side are to be accessed and multiplexer 30 controls connection of the sense amplifier 10 to BL pairs 70 and 72 when memory cells on the "b" side are to be accessed.

The restore circuits 40 and 50 ensure that their associated BLs are precharged to the correct voltage and that the voltages on the BL and BL complement lines in a BL pair are equalized within a suitable time period. For each BL pair on the "t" side, restore circuit 40 includes two charging transistor pairs 42 connected to the BL and BL complement nodes, and an equalization transistor 44 connected across the BL and BL complement nodes. The transistor pairs 42 are activated by a restore control signal called EQLt. Similarly, for each BL pair on the "b" side, restore circuit 50 includes two charging transistor pairs 52 connected to the BL and BL complement nodes, and an equalization transistor 54 connected across the BL and BL complement nodes. The charging transistor pairs 52 are activated by a restore control signal called EQLb. An additional enhancement mode leakage limiting transistor is provided for each of the restore circuits, shown at 90 for restore circuit 40 and at 92 for restore circuit 50. In one example, the transistors 90 and 92 are enhancement mode type transistors. The drains of the transistors 90 and 92 are connected to a voltage source, called $V_{BLEQ}$, and the gates of the transistors 90 and 92 are connected to a voltage called $V_{INT}$. The source of each of the transistors 90 and 92 are connected to the pair of charging transistors in the restore circuits 40 and 50, respectively. The control signals shown for the sense amplifier 10 are known and one with ordinary skill in the art would understand their operation.

The transistors 90 and 92 perform both a voltage regulation function and a leakage current limiting function. The voltage regulation function involves supplying a sufficient amount of current from the voltage reference source $V_{BLEQ}$ to bring the BLs of a BL pair to the proper voltage in a required amount of time. This time is usually short and occurs at the beginning of a precharge period when an array activation is concluded. The leakage current limiting function involves maintain the voltage levels on the BL's that have been established at the beginning of the precharge period while also preventing excessive current from flowing from voltage reference source to the BLs in the event there is a BL leakage anomaly causing a short-circuit between a BL and a wordline (WL) in that part of the memory array. This function is relevant to the time period after the BL's have been initially precharged and equalized. When transistors 90 and 92 are sized to perform the voltage regulation function well the current level they can limit to in the event of a short becomes too high for low power DRAM applications. Conversely, when transistors 90 and 92 are sized for a sufficiently low limiting current the resulting regulation current level is too low to regulate BL voltage level adequately during the initial precharge and equalization.

FIG. 2 shows another type of conventional sense amplifier circuitry for a semiconductor memory device. In this example, enhancement mode leakage limiting transistors previously associated with the restore circuits 40 and 50 are changed to depletion mode transistors 100 and 102. The gate and source of each of the transistors 100 and 102 are connected together, and to the pair of charging transistors in their respective restore circuits 40 and 50, respectively. The drains of transistors 100 and 102 are connected to the voltage source $V_{BLEQ}$. With transistors 100 and 102 configured in this way they have a saturation characteristic. As voltage across the transistor is increased, it reaches a limiting saturation current. When transistors 100 and 102 are sized to perform the voltage regulation function well the current level they can limit to in the event of a short is lower than the limiting current that results with using an enhancement mode transistor. This lower limiting current level is an improvement over the use of an enhancement mode limiting transistor but still results in too high of a leak current for low power DRAM applications. Conversely, when transistors 100 and 102 are sized for a sufficiently low limiting current the resulting regulation current level is still too low to regulate BL voltage level adequately during an initial precharge period.

Because of the inherent conflict between regulation requiring a larger current level for a short duration and a current limiting characteristic requiring a lower current level over a long duration it is undesirable to provide one transistor device to perform both voltage regulation and leakage current reduction functions simultaneously.

SUMMARY OF THE INVENTION

Briefly, circuit arrangements and methods are provided for regulating and maintaining voltage on bitlines of a semiconductor memory device. According to one embodiment, first and second regulation devices are connected to a charging circuit. At the beginning of a charging period, voltage on the bitlines is regulated with the second regulation device as the bitlines are initially charged to a voltage. After initially charging the bitlines to the voltage, voltage on the bitlines is regulated with the first regulation device that also limits current to the bitlines when there is a leakage anomaly associated with the bitlines. An enhancement to this embodiment is provided whereby, during relatively long charging periods, the second regulation device is not activated and instead the first regulation device supplies current to precharge the bitlines as they are initially charged and thereafter regulates and limits current to the bitlines when there is a leakage anomaly associated with the bitlines.

According to another embodiment, a charging circuit that is connected to sense nodes of a sense amplifier while the sense nodes are connected to the bitlines is activated so that the charging circuit assists in charging the bitlines at the beginning of a charging period. After the bitlines are initially charged at the beginning of the charging period, voltage on the bitlines is regulated with a first regulation device that regulates current to the bitlines and limits current to the bitlines when there is a leakage anomaly associated with the bitlines.

DETAILED DESCRIPTION

Figure 1:
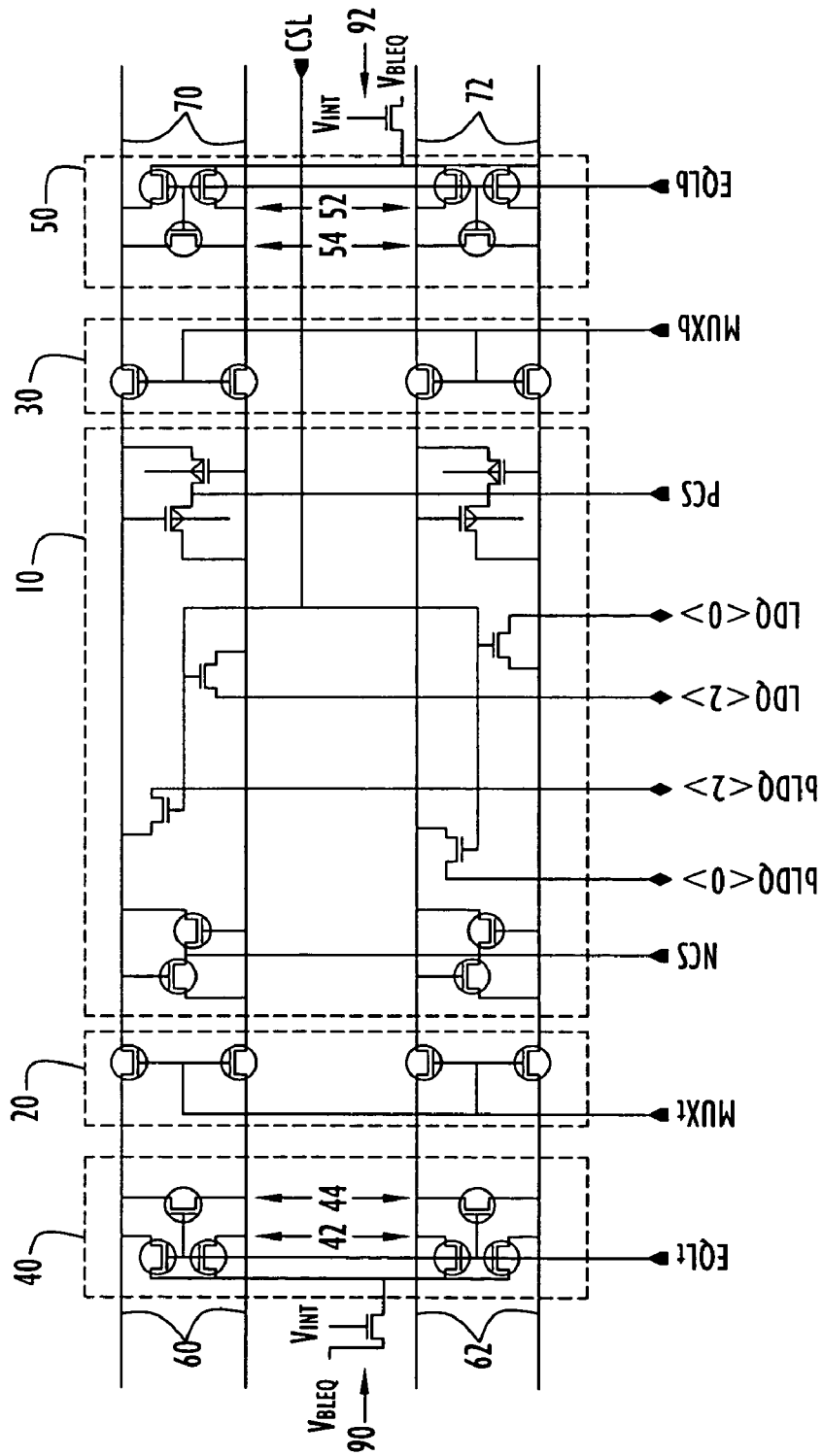
FIG. 1 is a schematic diagram of a first type of conventional sense amplifier circuitry associated with a sense amplifier circuitry in a semiconductor memory device.
Figure 2:
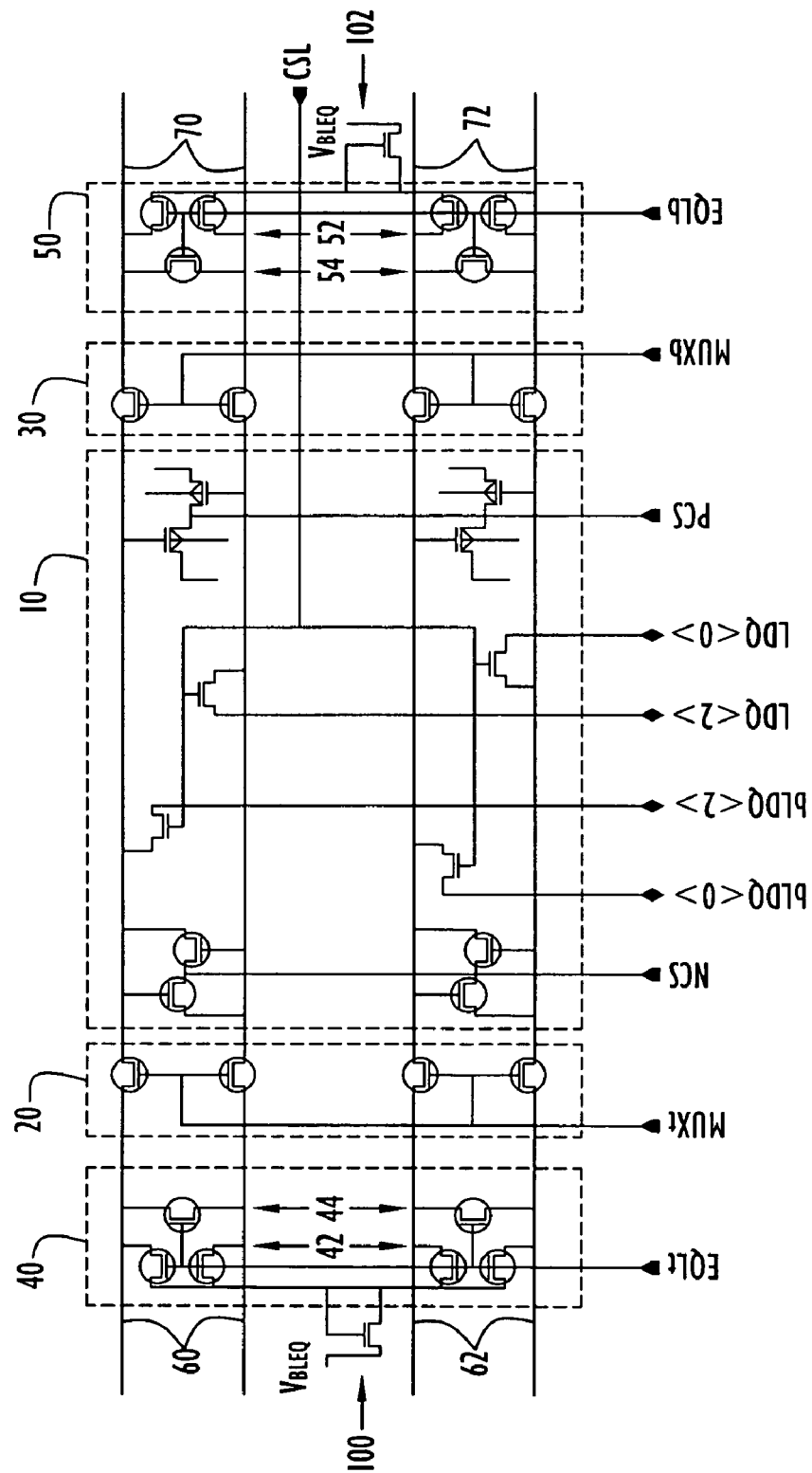
FIG. 2 is a schematic diagram of a second type of conventional sense amplifier circuitry associated with a sense amplifier in a semiconductor memory device.
Figure 3:
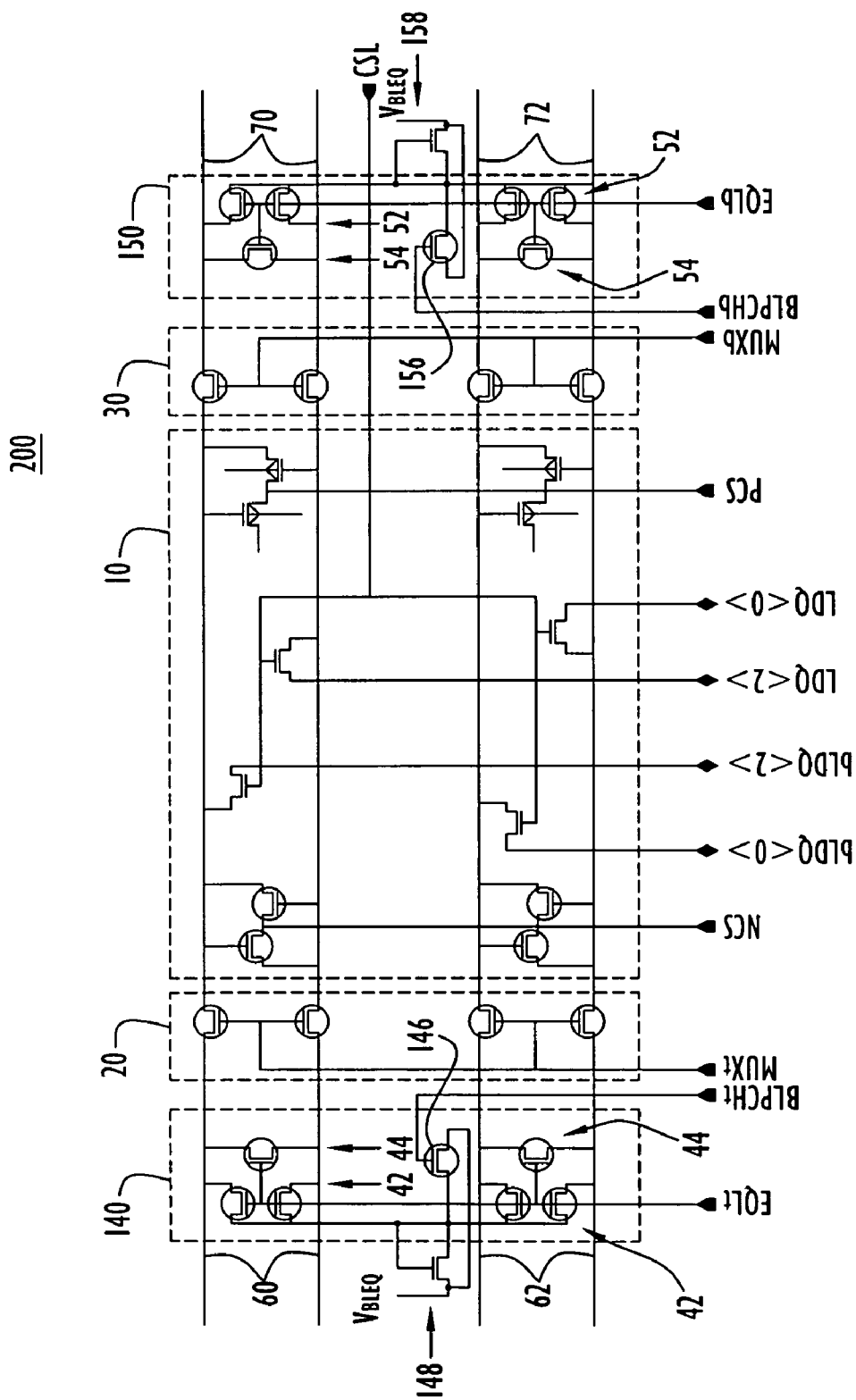
FIG. 3 is a schematic diagram of a first embodiment.

Referring first to FIG. 3, according to one embodiment a sense amplifier circuit arrangement 200 is provided in which two different devices are provided in the bitline (BL) charging and leakage limiting path, a first regulation device that is better suited for BL leakage current limiting after the BLs are initially charged, and a second regulation device that is better suited for voltage regulation when initially charging the BLs during a charging period. The first regulation device has a lower saturated current and the second regulation device provides a substantially larger saturated current and can be turned off as needed.

On the "t" side of the sense amplifier 10 and associated with restore circuit 140, there is a first transistor 146 of a first type and a second transistor 148 of a second type. In one embodiment, transistor 146 is an enhancement mode device having its gate connected to a control signal called BLPCHt and its drain connected to the voltage source, $V_{BLEQ}$. The source of the transistor 146 is connected to the charging transistor pairs 42 of the restore circuit 140. According to one embodiment, the transistor 148 is a depletion mode device having its gate and drain connected together and to the charging transistor pairs 42. The source of the transistor 148 is connected to a voltage reference source $V_{BLEQ}$. Thus, the transistors 146 and 148 are connected in parallel with each other. There is a multiplexer circuit 20 on the "t" side of the sense amplifier 10 that controls the connection of the sense amplifier 10 to the BL pairs 60 and 62. The term "restore" as used herein in connection with the term "restore circuit" is meant to include a circuit that only charges the BLs, or that charges and equalizes the nodes (or BLs) to which it is connected.

Similarly, on the "b" side of the sense amplifier 10 and associated with restore circuit 150, there is a first transistor 156 of a first type and a second transistor 158 of a second type. Transistor 156 is an enhancement mode device. The gate is connected to a control signal called BLPCHb and its drain is connected to the voltage source, $V_{BLEQ}$. The source of the transistor 156 is connected to the charging transistor pairs 52 of the restore circuit 150. Transistor 158 is a depletion mode device having its gate and drain connected together and to the charging transistor pairs 52. The source of transistor 158 is connected to a voltage reference source $V_{BLEQ}$. The transistors 156 and 158 are connected in parallel with each other. There is a multiplexer circuit 30 on the "b" side of the sense amplifier 10 that controls the connection of the sense amplifier 10 to the BL pairs 70 and 72.

Thus, according to the embodiment shown in FIG. 3, there are two transistors provided in the BL charging and leakage limiting path on each side of the sense amplifier 10. The depletion mode transistors 148 and 158 on their respective sides of the sense amplifier 10 serve as a first regulation device that after the associated BLs are initially charged and equalized, regulates current and limits current from the voltage source $V_{BLEQ}$ to the associated BLs when there is a leakage anomaly associated with the BLs. A BL leakage anomaly or anomalous bitline leakage may be due to low resistive path defects (e.g., short-circuits), excessive junction leakage, or other causes. The anomaly may cause the BL to be pulled to a low voltage, possibly a negative voltage called negative wordline low ($V_{NWL}$). The depletion mode transistors 148 and 158 are examples of devices that are well suited for voltage regulation after the BLs are already initially charged to their target voltage to perform a lesser degree of voltage maintenance regulation and more importantly to perform the BL leakage limiting function.

By contrast, the enhancement mode transistors 146 and 156 on the respective sides of the sense amplifier 10 regulate charging of the BLs as they are initially charged at the beginning of the charging period. Furthermore, the control signals BLPCHt and BLPCHb control the enhancement mode transistor 146 and 156, respectively, so as to regulate the current supplied from the voltage reference $V_{BLEQ}$ at the beginning of a charging period up to the point in time that the respective BLs have substantially reached the correct voltage, then the control signals BLPCHt and BLPCHb turn off the transistor 146 and 156, respectively. During the time interval when the enhancement mode transistors 146 and 156 are on, the depletion mode transistors 148 and 158 are on but the voltage regulation function of the enhancement mode transistors 146 and 156 overrides the voltage regulation function of the depletion mode transistors 146 and 156, respectively, when initially charging the BLs are at the beginning of a charging period. After the enhancement mode device has turned off any leakage that may occur as a result of BL leakage anomaly is limited by the depletion mode transistors 148 and 158. It is no longer necessary to keep transistors 146 and 156 on because the depletion mode transistors 148 and 158 are responsible for leakage limiting.

The sizes (channel lengths) of the transistors 146,148 and 156,158 can be optimized for their respective functions. The depletion mode transistors 148 and 158 can be designed such that their threshold voltage and size are optimized exclusively for leakage limiting for a BL leakage anomaly since they are regulating after the BLs are initially charged and therefore the voltage regulation performance needed from them is weaker than that of transistors 148,158. On the other hand, the enhancement mode transistors 146 and 156 may be sized for voltage regulation optimized for regulation when the bitlines are being relatively rapidly charged since enhancement mode transistors 146 and 156 are responsible for regulation only when initially charging the BLs to their target voltage at the beginning of a charging period. Stronger voltage regulation performance characteristics are needed for the transistors 146,156 than for transistors 148,158. This sense amplifier circuit arrangement achieves a BL charging regulation for high performance short (normal) charging cycle modes while also allowing for reducing array leakage current associated with a BL leakage anomaly for low power applications.

While the embodiments described herein refer to depletion mode and enhancement mode transistor device for the first and second regulation devices, the present invention is not limited to such. Any device that has a lower saturated current may be used for the first regulation device and any device that has a substantially larger saturated current and can be turned off as needed may be used for the second regulation device. While metal oxide silicon field effect transistors (MOSFETs) have been described in the embodiments herein for the first and second regulation devices, the functions of the first and second regulation devices be performed by bipolar transistors, junction field effect transistors (JFETs), where one of these alternative transistor technologies used for the function of enhancement transistor has a higher saturated current and for the function of the depletion mode transistor and has a lower saturated lower current for leakage limiting for longer operation durations. Furthermore, an appropriately valued resistor may be used in place of the (first regulation device) depletion mode transistors 145,158 since these transistors are generally not turned off.

Figure 4:
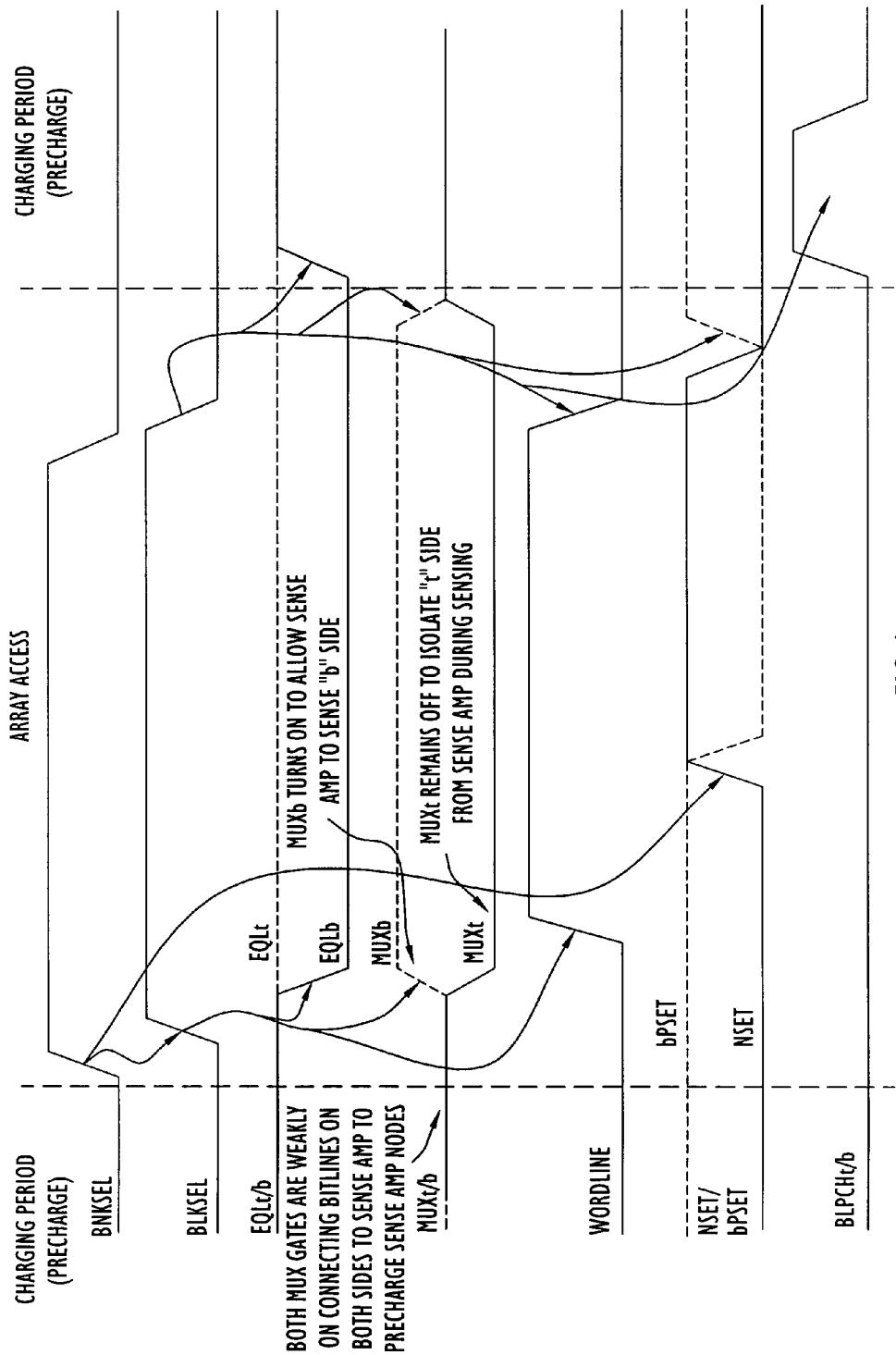
FIG. 4 is a timing diagram showing operation of the first embodiment shown in FIG. 3.

Turning to FIG. 4, an exemplary timing diagram depicting operation of the embodiment shown in FIG. 3 is described. It is assumed that before the block select (BLKSEL) signal goes high indicating that a particular block of the memory has been selected, that the multiplexers 20 and 30 are both weakly on connecting the BLs on their respective sides to the sense amplifier 10 to precharge the sense nodes of the sense amplifier 10. During this period of time, the restore control signals EQLt and EQLb are high turning on the devices in the restore circuits 140 and 150, respectively, for precharging and equalizing their respective BLs. This time period is called a charging period and in the first charging period depicted it is assumed that the BLs are already initially charged and therefore the enhancement mode transistors 146 and 156 are off because the control signals BLPCHt and BLPCHb are low. The depletion mode transistors 148 and 158 are operational at this time to weakly regulate the voltage on the respective BL pairs by the charging transistors 142 and 152 in the respective restore circuits 140 and 150, and to limit any leakage current from the voltage reference $V_{BLEQ}$ to the BLs when and if there is a BL leakage anomaly on the corresponding side of the sense amplifier. After the bank select (BNKSEL) signal goes high, BLKSEL goes high indicating that one of the memory arrays is to be selected. Thus, the charging period ends and an array access period begins.

When a memory array on one side of the sense amplifier 10 is selected, only the multiplexer associated with that selected memory is turned on. In the exemplary embodiment shown in FIG. 4, the memory on the "b" side of the sense amplifier 10 is selected and the multiplexer control signal MUXb goes high, turning multiplexer 30 strongly on to connect the sense amplifier 10 to the memory array on the "b" side. The multiplexer control signal MUXt goes low so that the multiplexer 20 is turned off and therefore isolating BLs on the "t" side from sense amplifier 10. The wordline voltage goes high after the MUXb signal goes high to enable access to the memory array on the "b" side. At the end of the access cycle, BLKSEL goes low causing wordline to go low and the restore control signal EQLb to return high. The MUXt/b signals also return to their weakly on states. Thus, the array access period ends and a new charging period begins.

After wordline goes low, the control signals BLPCHt and BLPCHb go high (are pulsed) to turn on the enhancement mode transistors 146 and 156, respectively, for a brief period of time in order to regulate the current supplied from the voltage reference $V_{BLEQ}$ as the BLs on the respective sides of the sense amplifier 10 are initially charged to their target voltage. The control signals BLPCHt and BLPCHb stay high for a period of time for the BLs to substantially reached the target voltage, and then go low. Again, during this time at the beginning of a charging period, the depletion mode transistors 148 and 158 are on but their regulation function is "overridden" by the regulation function of the enhancement mode transistors 146 and 156, respectively, when the BLs are initially charged. Thus, the enhancement mode transistors 146 and 156 are activated to perform regulation for short period of time at the beginning of a charging period. For the remainder of the charging period, the depletion mode transistors 148 and 158 remain on to continue weaker regulation (maintenance) of the BL voltage and to limit any leakage current caused by a BL leakage anomaly.

A further enhancement to the embodiments described above is to not activate the second regulation device, the enhancement mode transistor, on each side of the sense amplifier during certain operational modes of a semiconductor memory device in which fast charging of the BLs is not necessary. As an example, and not by way of limitation, in a dynamic random access memory (DRAM) device, there is a mode call a "self-refresh mode", during which access is made to each of the memory cells. During this mode, the charging period for BLs is longer than during a normal precharge interval. Therefore, the stronger voltage regulation performance of the second regulation device is not necessary and the BLs can be regulated solely by the first regulation device, the depletion mode transistors.

Figure 5:
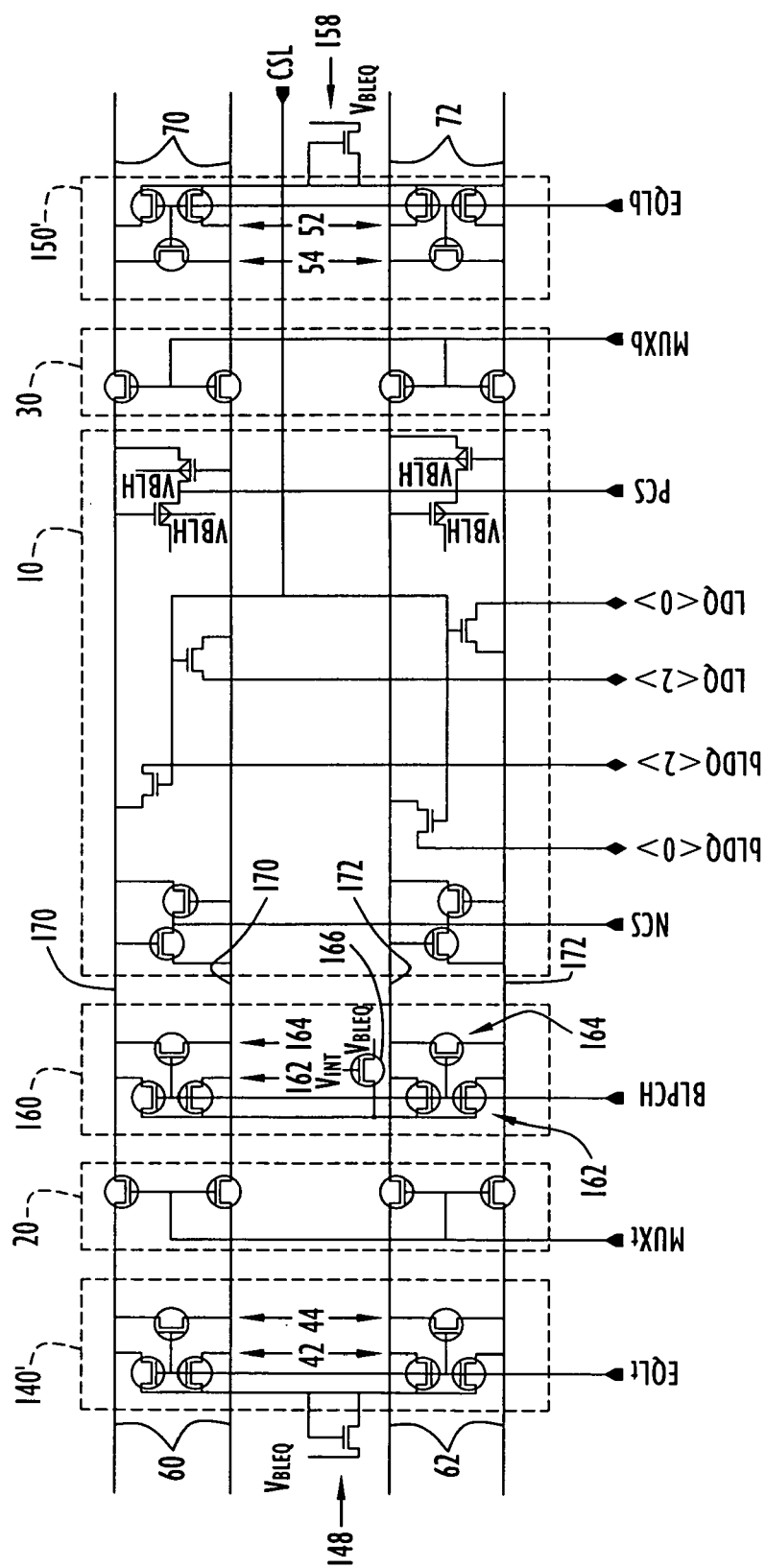
FIG. 5 is a schematic diagram of a second embodiment.

Turning to FIG. 5, another embodiment is shown in which the restore circuits 140' and 150' are similar to circuits 140 and 150 shown in the embodiment of FIG. 4 except they lack the enhancement mode transistors 146 and 156, respectively. An additional internal restore circuit 160 is provided that is connected to the sense node pairs 170 and 172. In one embodiment, the restore circuit 160 is connected to the sense amplifier 10 on the "t" side, but it could just as well be connected to the sense node pairs 170 and 172 on the "b" side. The restore circuit 160 is responsive to an internal restore circuit control signal BLCPH.

In one embodiment, the additional internal restore circuit 160 comprises, for each sense node pairs 170 and 172, a charging transistor pair 162 and an equalization transistor 164. In addition, in one embodiment, the restore circuit 160 comprises an enhancement mode transistor 166. The gate of transistor 166 is connected to $V_{INT}$, the drain is connected to the voltage source $V_{BLEQ}$, and the source is connected to the sources of the charging transistor pairs 162. Thus, transistor 166 is activated when the charging transistor pairs 162 are turned on by the restore control signal BLPCH. An equalization transistor 164 is connected across sense nodes of each of the sense node pairs 170 and 172. The regulating function of the enhancement mode transistor 166 is similar to that of the enhancement mode transistors 146 and 156 and is shared by the "t" side and "b" side of the sense amplifier 10 when needed. Thus, the embodiment shown in FIG. 5 achieves better space efficiency by using a single enhancement mode transistor for the arrays on both sides of the sense amplifier.

According to an alternative embodiment, the enhancement mode transistor 166 connected to the restore circuit 160 is not provided. For example, the enhancement mode transistor 166 may not be needed if the control signal BLPCH to the restore circuit 160 is kept on only briefly (a short pulse) and not as long as the off time interval of the EQLt/b signals during access to a memory array. On other hand, if the control signal BLPCH stays on for nearly the same duration as the time interval that the EQLt/b signals are on, then the enhancement transistor 166 is useful. According to still another alternative embodiment, the equalization transistors 164 in the internal restore circuit 160 are not needed for some applications.

Figure 6:
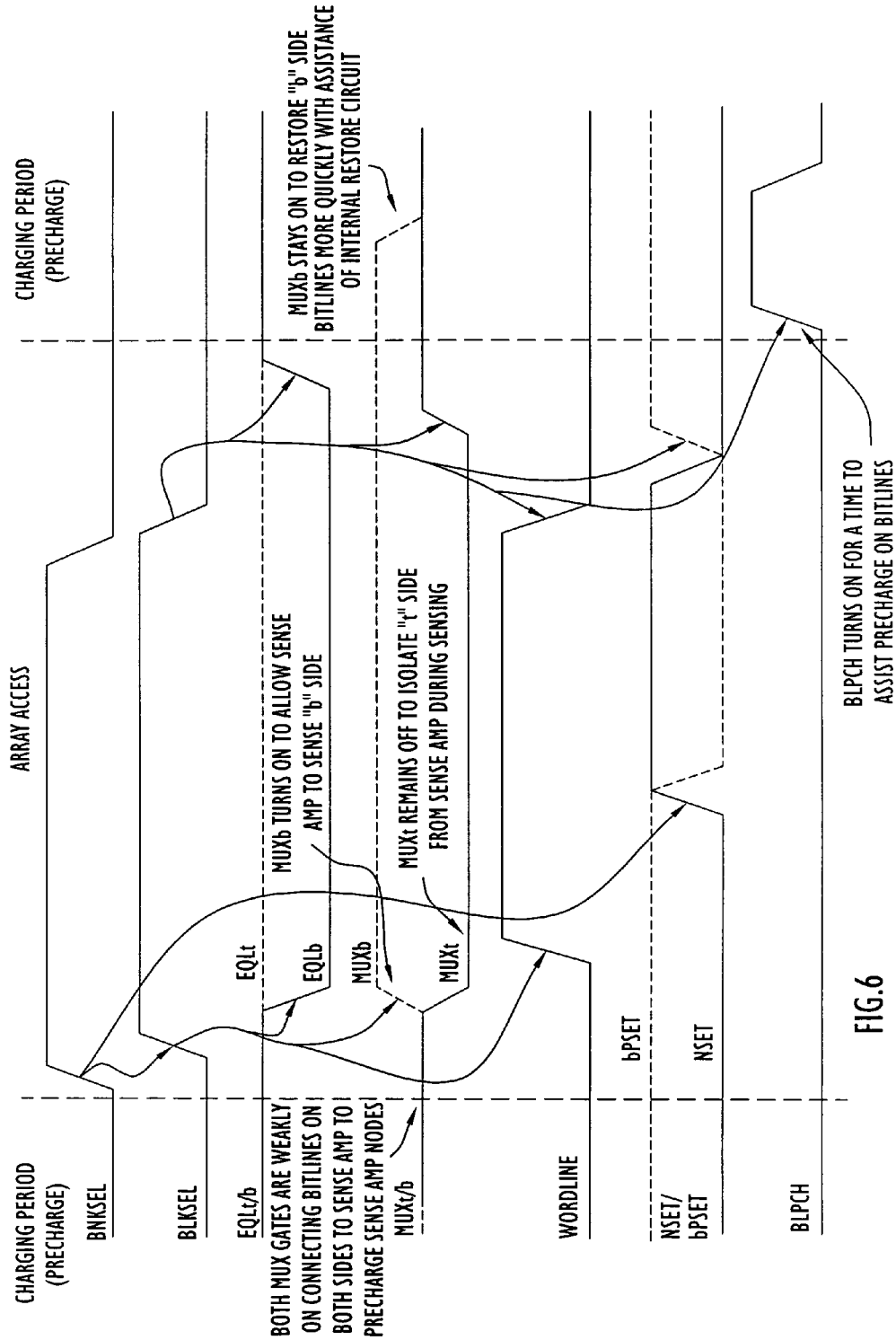
FIG. 6 is a timing diagram showing operation of the second embodiment shown in FIG. 5.

Turning to FIG. 6, an exemplary timing diagram depicting operation of the embodiment shown in FIG. 5 is described. The timing diagram of FIG. 6 is similar to FIG. 4. The depletion mode transistors 148 and 158 are on while the EQLt and EQLb signals are high during a charging period and therefore perform (weaker) voltage regulation as well as leakage current limiting. After access of a memory array (in this example an array on the "b" side of the sense amplifier 10) is completed, the internal restore circuit control signal BPLCH goes high to activate the restore circuit 160 for a period of time and the control signal MUXb for the multiplexer 30 stays on longer to allow the charging transistor pairs 162 in the restore circuit 160 to assist the charging transistors 52 of the restore circuit 150' in precharging or restoring the voltage on the BLs on the "b" side of the sense amplifier 10 at the beginning of the next charging period. Also, during at least part of this time, the EQLb signal returns high so that the depletion mode transistor 158 is operational with the charging transistor pairs 52 to perform a voltage regulation function. A similar function would be provided through multiplexer 20 on the "t" side to assist circuit 140' in precharging the BLs on the "t" side. Similar to the embodiments of FIGS. 3 and 4, during the time period before and after a memory array access occurs, the multiplexers 20 and 30 are both weakly on and the restore control signals EQLt and EQLb are high thereby turning on the devices in the restore circuits 140' and 150', respectively, for precharging and equalizing their respective BLs. Consequently, the depletion mode transistors 148 and 158 are operational to regulate the voltage applied to the respective BL pairs by the charging transistors 142 and 152 in the respective restore circuits 140' and 150' and to limit any BL leakage current that may occur as a result of a BL leakage anomaly as in the embodiments of FIGS. 3 and 4.

In an embodiment in which the enhancement mode transistor 166 associated with the restore circuit 160 is included, then the BLPCH signal would rise at the same time as EQLb and then fall a short time later, similar to BLPCHt/b in FIG. 4. Furthermore, the enhancement described above where the enhancement mode transistor, if provided, in the embodiment on FIG. 5, can be deactivated during longer charging periods, such as self-refresh.

The system and methods described herein may be embodied in other specific forms without departing from the spirit or essential characteristics thereof. The foregoing embodiments are therefore to be considered in all respects illustrative and not meant to be limiting.

What is claimed is:

1. A circuit arrangement for a dynamic random access memory device, comprising:
   a. a charging circuit connected to bitlines of the memory device to charge the bitlines to a voltage in response to a control signal; and
   b. first and second regulation devices connected to said charging circuit, the first regulation device being operational when said charging circuit is operational to regulate and limit current to the bitlines when there is a leakage anomaly associated with said bitlines and the second regulation device being activated at a beginning of a charging period to regulate current flow from the charging circuit to the bitlines as the bitlines are initially charged by said charging circuit.

2. The circuit arrangement of claim 1, wherein the first regulation device is a transistor having a relatively low saturated current and the second regulation device is a transistor having a relatively higher saturated current.

3. The circuit arrangement of claim 1, wherein the first regulation device is a depletion mode transistor, and the second regulation device is an enhancement mode type transistor.

4. The circuit arrangement of claim 2, wherein the first regulation device has a threshold voltage and size optimized for leakage limiting and the second regulation device has a size that is optimized for voltage regulation when the bitlines are being rapidly charged to said voltage.

5. The circuit arrangement of claim 1, wherein the second regulation device is activated for a time interval at said beginning of said charging period and is subsequently deactivated after the bitlines have substantially reached said voltage.

6. The circuit arrangement of claim 5, wherein during said time interval said second regulation device overrides a regulation function of said first regulation device at the beginning of said charging period, and thereafter said first regulation device regulates said charging circuit to maintain voltage on said bitlines.

7. The circuit arrangement of claim 1, wherein during relatively long charging periods, said second regulation device is not activated so that said first regulation device regulates the charging of the bitlines as they are initially charged and thereafter regulates and limits current to the bitlines when there is a leakage anomaly associated with the bitlines.

8. A circuit arrangement for a dynamic random access memory device, comprising:
   a. a sense amplifier comprising sense nodes;
   b. bitlines coupled to the sense amplifier;
   c. a first charging circuit connected to the bitlines to charge the bitlines to a voltage in response to a first control signal;
   d. a multiplexer coupled between the sense nodes and the bitlines and responsive to a second control signal to connect said sense nodes to said bitlines;
   e. a first regulation device connected to the first charging circuit that is operational when said charging circuit is operational to regulate voltage on the bitlines and to limit leakage current when there is a leakage anomaly associated with said bitlines; and
   f. a second charging circuit connected to said sense nodes and responsive to a third control signal while said multiplexer is connecting said sense nodes to said bitlines so that said second charging circuit also charges said bitlines at a beginning of a charging period.

9. The circuit arrangement of claim 8, and further comprising a second regulation device connected to the first charging circuit that is activated at the beginning of a charging period to regulate current to said bitlines from said first charging circuit as the bitlines being initially charged.

10. The circuit arrangement of claim 9, wherein the first regulation device is a depletion mode transistor, and the second regulation device is an enhancement mode transistor.

11. The circuit arrangement of claim 9, wherein the first regulation device has a threshold voltage and size optimized for leakage limiting and the second regulation device has a size that is optimized for voltage regulation when the bitlines are being rapidly charged to said voltage.

12. The circuit arrangement of claim 9, wherein the multiplexer is responsive to the second control signal to maintain connection between the sense nodes and the bitlines for an extended time interval during which the third control signal activates the second charging circuit.

13. The circuit arrangement of claim 9, wherein during relatively long charging periods, said second regulation device is deactivated so that said first regulation device regulates the charging of the bitlines as they are initially charged and thereafter regulates and limits current to the bitlines when there is a leakage anomaly associated with the bitlines.

14. A dynamic random access memory device, comprising:
   a. means for sensing charge from bitlines;
   b. means for selectively connecting the means for sensing to said bitlines;
   c. means for charging said bitlines to a voltage;

d. first regulating means connected to said means for charging, wherein said first regulating is operational when said charging circuit is operational to regulate and limit current to the bitlines when there is a leakage anomaly associated with said bitlines; and e. second regulating means connected to said means for charging, wherein said second regulating means is activated at a beginning of a charging period to regulate current to said bitlines as the bitlines are initially charged by said means for charging.

15. The device of claim 14, wherein said second regulating means is activated for a time interval at said beginning of said charging period and is subsequently deactivated after the bitlines have substantially reached said voltage.

16. The device of claim 14, wherein during relatively long charging periods, said second regulation means is deactivated so that said first regulation means regulates the charging of the bitlines as they are initially charged and thereafter regulates and limits current to the bitlines when there is a leakage anomaly associated with the bitlines.

17. A method for regulating voltage on bitlines in a dynamic random access memory device using first and second regulation devices associated with a charging circuit for the bitlines, comprising:

a. at a beginning of the charging period, regulating voltage on said bitlines with said second regulation device as the bitlines are initially charged to a voltage; and b. after initially charging the bitlines to said voltage, regulating voltage on the bitlines with the first regulation device that also limits current to the bitlines when there is a leakage anomaly associated with said bitlines.

18. The method of claim 17, wherein (a) regulating comprises activating said second regulation device at the beginning of the charging period and deactivating said second regulation device after said bitlines have substantially reached said voltage.

19. The method of claim 17, wherein (a) regulating comprises activating an enhancement mode transistor connected to the charging circuit, and (b) regulating comprises regulating voltage on said bitlines with a depletion mode transistor connected to the charging circuit.

20. The method of claim 17, and further comprising, during relatively long charging periods, regulating voltage on said bitlines solely with said first regulation device as the bitlines are initially charged and thereafter to regulate and limit current to the bitlines when there is a leakage anomaly associated with the bitlines.

21. A method for regulating voltage on bitlines of a dynamic random access memory device, comprising:

a. activating a charging circuit that is connected to sense nodes of a sense amplifier while said sense nodes are connected to said bitlines so that said charging circuit assists in charging said bitlines at the beginning of a charging period; and b. after the bitlines are initially charged at the beginning of the charging period, regulating voltage on the bitlines with a first regulation device that regulates current to said bitlines and that limits current to the bitlines when there is a leakage anomaly associated with said bitlines.

22. The method of claim 21, and further comprising maintaining a connection between the sense nodes and the bitlines for an extended time interval during which the charging circuit is activated.

\* \* \* \* \*